United States Patent [19]

Okada et al.

[11] Patent Number: 4,947,173

[45] Date of Patent: Aug. 7, 1990

[54] SEMICONDUCTOR INTEGRATED CIRCUIT

[75] Inventors: Keisuki Okada; Sumitaka Takeuchi; Masatoshi Kimura, all of Hyogo, Japan

[73] Assignee: Mitsubishi Denki Kabushiki Kaisha, Tokyo, Japan

[21] Appl. No.: 241,877

[22] Filed: Sep. 8, 1988

[30] Foreign Application Priority Data

Sep. 9, 1987 [JP] Japan ................................ 62-225547

[51] Int. Cl.[5] ................................................ H03M 1/36

[52] U.S. Cl. .................................... 341/160; 341/200; 364/841; 364/606

[58] Field of Search ........................ 341/50, 55, 75, 99, 341/138, 158, 159, 160, 200; 364/606, 754, 841

[56] References Cited

U.S. PATENT DOCUMENTS

| | | | |
|---|---|---|---|
| 2,715,678 | 8/1955 | Barney | 341/200 |
| 4,470,126 | 9/1984 | Haque | 364/606 |
| 4,586,025 | 4/1986 | Knierim | 341/160 |
| 4,752,731 | 6/1988 | Toda | 364/606 |
| 4,766,416 | 8/1988 | Moujaim | 341/138 |
| 4,866,443 | 9/1989 | Okada et al. | 341/159 |

FOREIGN PATENT DOCUMENTS

| | | | |
|---|---|---|---|
| 217009 | 4/1987 | European Pat. Off. | 341/159 |
| 95621 | 5/1986 | Japan | 341/159 |

OTHER PUBLICATIONS

IEEE J. of Sol. St. Circuits: "Monolithic Expandable 6 Bit 20 MHz CMOS/SOS A/D Converter", by A. Dingwall, V. SC-14, No. 6, Dec. 1979, pp. 926–932.

Stark, Henry et al., "Modern Electrical Communications Theory and Systems", Prentice Hall, Inc., New Jersey, pp. 324–325.

*Primary Examiner*—William M. Shoop, Jr.
*Assistant Examiner*—Howard L. Williams
*Attorney, Agent, or Firm*—Lowe, Price, LeBlanc, Becker & Shur

[57] ABSTRACT

First and second comparator groups compare first and second analogue signals applied thereto, respectively, with reference voltages and convert the results of the comparison to binary signals to output the binary signals to an encoding circuit. The encoding circuit converts the binary signals supplied from the first and second comparator groups to digital data of a binary code corresponding to the product of the first and second analogue signals to output the digital data.

20 Claims, 5 Drawing Sheets

FIG. 6 PRIOR ART
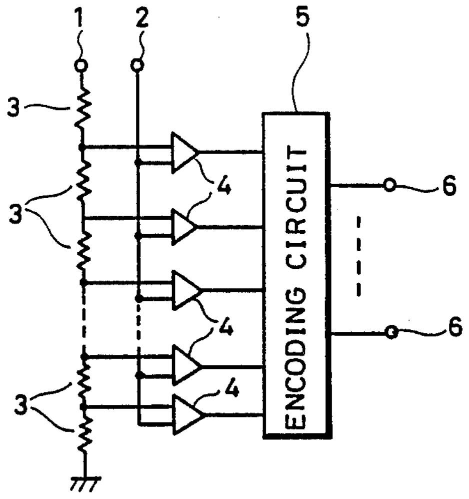
FIG. 7 PRIOR ART
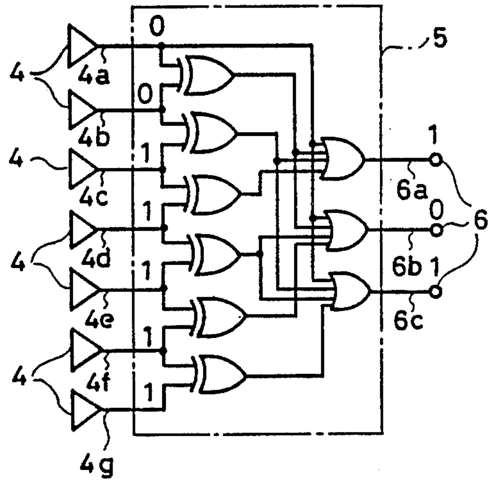
FIG. 8 PRIOR ART
(a)
| 4a | 4b | 4c | 4d | 4e | 4f | 4g |
|---|---|---|---|---|---|---|
| 0 | 0 | 1 | 1 | 1 | 1 | 1 |
COMPARATOR OUTPUT = 5
(b)
| 6a | 6b | 6c |
|---|---|---|
| 1 | 0 | 1 |
ENCODED OUTPUT = 5

SEMICONDUCTOR INTEGRATED CIRCUIT

BACKGROUND OF THE INVENTION

1. Field of the Invention

The present invention relates to semiconductor integrated circuits and more particularly to a semiconductor integrated circuit in which a product between analogue signals is evaluated and the result of the evaluation is converted to a digital code and outputted.

2. Description of the Prior Art

According to recent developments in digital integrated circuits, there is an increasing demand for digital signal processing for purposes of enhancing performance, integration scales and capabilities even in technical fields in which signal processing was performed in analogue circuits. For example, in order to process, in a digital manner, voice, images and the like which are inherently analogue signals, an analogue-to-digital (A/D) converter is indispensably required.

FIGS. 4A to 4C are block diagrams of various modulation systems in conventional analogue circuits. The constructions shown in FIGS. 4A to 4C are shown for example in "Modern Electrical Communications Theory and Systems" by H. Stark et al., page 325. FIG. 4A shows an amplitude modulation system, FIG. 4B shows a phase modulation system, and FIG. 4C shows a frequency modulation system. In each of those three systems, it is necessary to obtain the product of two analogue signals, i.e., an input signal S(t) and a carrier wave (cos $\omega_c t$ or sin $\omega_c t$ case, two methods as shown in FIGS. 5A and 5B are considered as to in which part of the circuit an A/D converter for converting an analogue signal to digital data is to be provided.

FIG. 5A shows a method in which the product of the analogue signals in each of the modulation systems shown in FIGS. 4A to 4C is obtained by an analogue multiplier and the product output is converted to digital data by the A/D converter. FIG. 5B shows another method in which one of the analogue signals is converted to digital data and the other analogue signal is obtained as digital data by reading out data from a ROM table where data has been written in a digitally converted form, whereby those digital data are multiplied by a digital multiplier.

FIG. 6 is a diagram showing a conventional A/D converter of a parallel comparison system described for example in "Monolithic Expandable 6-bit 20 MHz CMOS/SOS A/D Converter" by A. Dingwall, IEEE, Journal of Solid State Circuits, Vol. SC-14, No. 6, Dec. 1979, pp. 926–932. Referring to FIG. 6, the A/D converter comprises a reference voltage terminal 1, an analogue input terminal 2, ladder resistors 3, comparators 4 arranged in parallel, an encoding circuit 5, and digital output terminals 6. The ladder resistors 3 define reference voltages of the respective comparators 4.

Now, operations of the A/D converter shown in FIG. 6 will be described. A voltage applied to the reference voltage terminal 1 is divided on resistance by the ladder resistors 3 so as to be received by an input terminal of each of the comparators 4. Each comparator 4 compares the reference voltage applied to the input terminal and a signal applied to the analogue input terminal 2 and outputs the result of the comparison. The outputs of the comparators 4 are coded by the encoding circuit 5 and the outputs thus coded appear as digital data at the output terminals 6. If the outputs are N bits, the number of comparators required is $2^N-1$.

Details of the A/D converter shown in FIG. 6 will be described with reference to concrete examples shown in FIGS. 7 and 8. FIG. 7 shows an A/D converter of a parallel comparison system of 3-bit straight binary code output. FIG. 8(*a*) and FIG. 8(*b*) show an example of a comparator output and an example of an encoded output, respectively, in the A/D converter shown in FIG. 7. Since this A/D converter is of the parallel comparison system, the outputs of the comparators 4 are all "1" (at high level) or "0" (at low level), or they are outputs where only one change point exists between the outputs "1" and the outputs "0", in the well known thermometer code representation. More specifically, the number of the contiguous outputs "1" out of the outputs of the respective comparators 4 corresponds to the value of the analogue input. In the case of FIG. 7, since a logic boundary exists between the terminals **4*b* and 4*c*, the number of the contiguous outputs "1" is five and this means that the value of the analogue input is "5". If the encoding portion 5 for the above described outputs of the comparators has a construction as shown in FIG. 7, the encoded output (the most significant bit being provided at a terminal 6*a***) is a binary code "5"(101) for the output "5" of the comparison.

If a product output between two analogue signals is obtained by conversion to digital data in the system shown in FIG. 5A or FIG. 5B by using the A/D converter of the parallel comparison system shown in FIGS. 6 and 7, the following disadvantages are involved.

First, in the system of FIG. 5A, two analogue input signals are multiplied by using an analogue multiplier; however, the analogue multiplier does not have a good precision. In addition, if the result of the multiplication of the analogue multiplier is to be converted to digital data by the A/D converter, the number of bits required in the A/D converter is twice larger than that in the case of FIG. 5B. As a result, a circuit area of the A/D converter is increased and the precision of the A/C converter is lowered. Furthermore, a considerable difficultly is involved in manufacturing the A/D converter.

On the other hand, in the system of FIG. 5B, two A/D converters are required (the ROM is also a kind of an A/D converter). Accordingly, a circuit configuration is complicated and requires a large size and the manufacturing cost comes to be high. In addition, although a digital multiplier is used for multiplication in the case of FIG. 5B, the digital multiplier has a complicated circuit configuration and a large size and it also has a disadvantage such as a slow processing speed due to a delay in transmission.

SUMMARY OF THE INVENTION

An object of the present invention is to provide a semiconductor integrated circuit having a digital multiplier of an analogue input type capable of processing at high speed and with high precision, which makes it possible to reduce a chip area.

Briefly stated, according to the present invention, an output of a first comparator group for comparing a first analogue signal with a reference potential, and an output of a second comparator group for comparing a second analogue signal with a reference potential are provided to an encoding circuit and the encoding circuit performs multiplication processing and coding processing for those two outputs of the comparator groups.

According to another aspect of the present invention, the encoding circuit receives an output from a comparator group and converts a result of squaring of the output signal of the comparator group to digital data of a binary code to output the digital data.

According to the present invention, the encoding circuit performs both multiplication processing and coding processing and, accordingly, compared with the case in which a multiplier and an A/D converter are separately provided as shown in FIG. 5A or FIG. 5B, a circuit area can be reduced. In addition, since the encoding circuit does not receive the analogue signal directly but receives data converted to a digital signal by a comparator group and performs evaluation process for the data digitally, a processing precision can be improved compared with a conventional analogue multiplier. Further, since the encoding circuit causes little delay in transmission compared with a conventional digital multiplier, a product can be evaluated at high speed.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a block diagram showing a construction of a conventional A/D converter of a parallel comparison system.

FIG. 7 is a circuit diagram showing a detailed construction of an A/C converter of a parallel comparison system for a 3-bit straight binary code output.

FIGS. 8(*a*) and 8(*b*) are illustrations showing examples of a comparator output and an encoded output of the A/C converter shown in FIG. 7.

DESCRIPTION OF THE PREFERRED EMBODIMENTS

Figure 1:
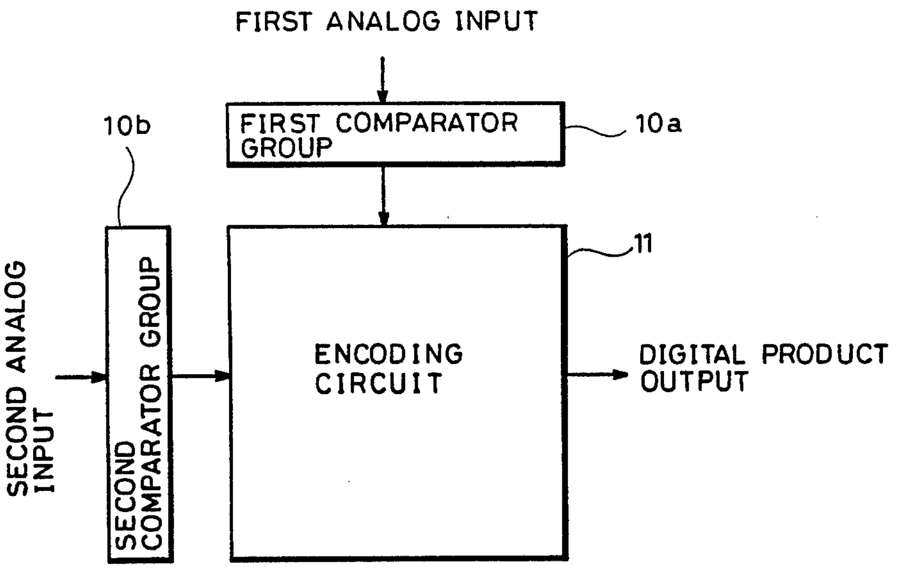
FIG. 1 is a block diagram showing a construction of a semiconductor integrated circuit of an embodiment of the present invention.

Referring first to FIG. 1, a schematic construction of an embodiment of the present invention will be described. A first analogue signal and a second analogue signal to be multiplied are supplied to a first comparator group 10*a* and a second comparator group 10*b*, respectively. The first comparator group 10*a* and the second comparator group 10*b* each have a plurality of comparators for comparing the input analogue signal with a reference voltage. The construction of each of the first and the second comparator groups 10*a* and 10*b* is the same as that in the conventional A/D converter shown in FIG. 6, except for the encoding circuit 5. Outputs of the first and the second comparator groups 10*a* and 10*b* are supplied to an encoding circuit 11. The encoding circuit 11 performs multiplication of the two inputs thus supplied and coding of those inputs to digital signals.

Figure 2A:
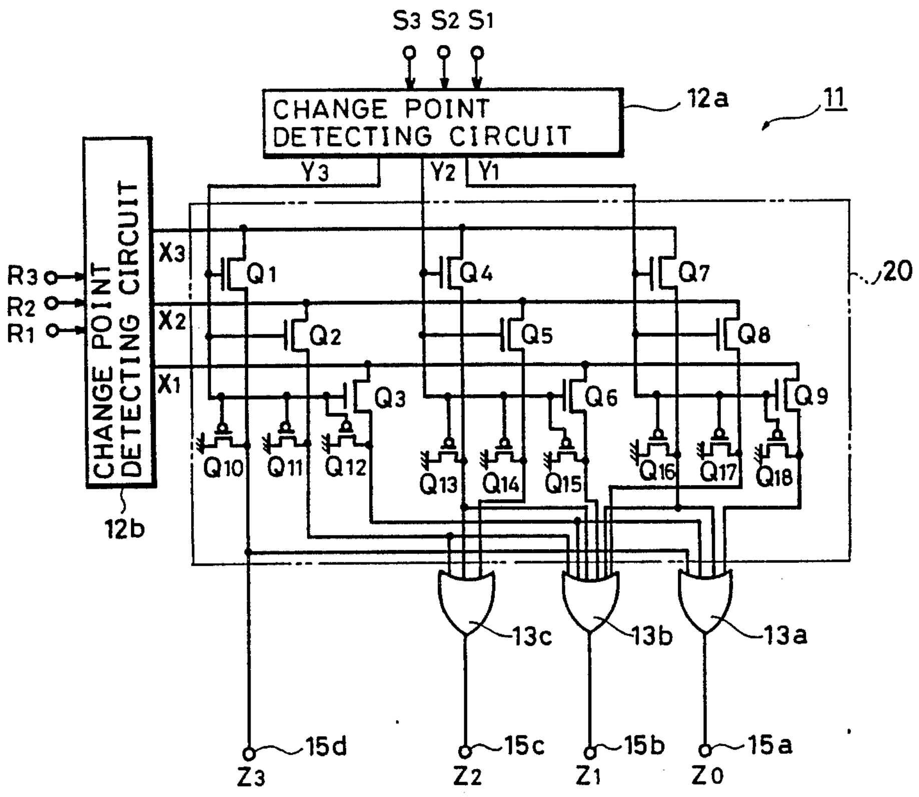
FIG. 2A is a circuit diagram showing details of an encoding circuit 11 shown in FIG. 1.
Figure 2B:
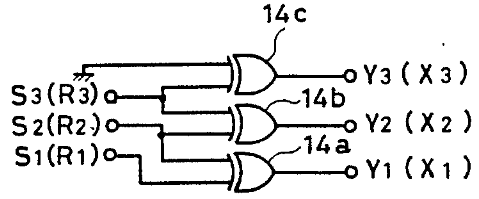
FIG. 2B is a circuit diagram showing details of a change point detecting circuit 12*a* (or 12*b*) in FIG. 2A.
Figure 4A:
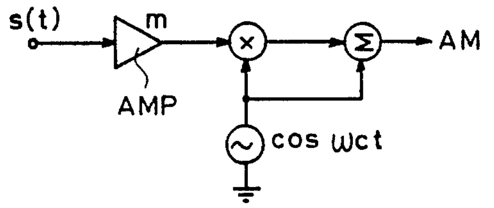
FIG. 4A PRIOR ART
FIGS. 4A to 4C are block diagrams showing various conventional modulation systems.
Figure 4B:
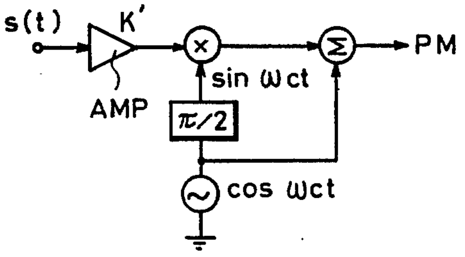
FIG. 4B PRIOR ART
Figure 4C:
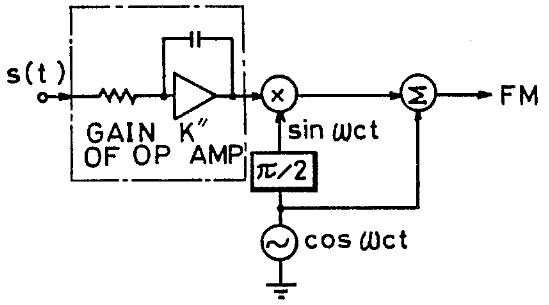
FIG. 4C PRIOR ART
Figure 5A:
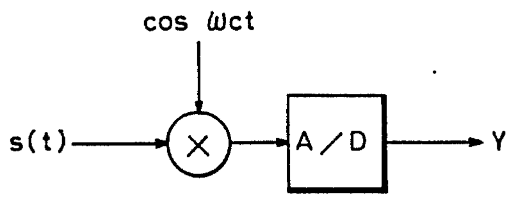
FIG.5A PRIOR ART
FIGS. 5A and 5B are block diagrams each showing a system for converting analogue data to digital data by using an A/D converter in the modulation systems shown in FIGS. 4A to 4C.
Figure 5B:
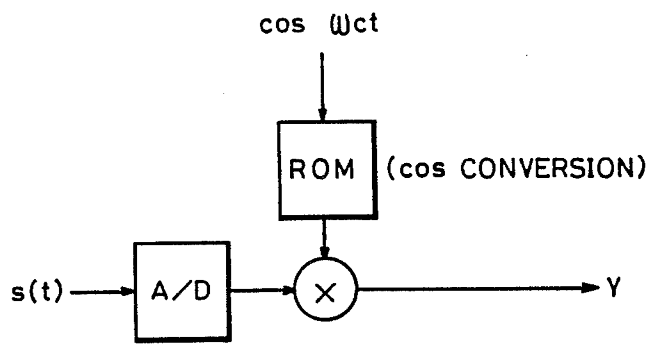
FIG.5B PRIOR ART

FIG. 2A is a circuit diagram showing details of the encoding circuit 11 in FIG. 1. Referring to FIG. 2A, output signals S1 to S3 of the first comparator group 10*a* are supplied to a change point detecting circuit 12*a*. Output signals R1 to R3 of the second comparator group 10*b* are supplied to a change point detecting circuit 12*b*. The change point detecting circuit 12*a* detects a point of change between the logics "1" and "0" in the output signals S1 to S3 of the first comparator group 10*a* and provides output signals Y1 to Y3 corresponding thereto. Similarly, the change point detecting circuit 12*b* detects a point of change between the logics "1" and "0" in the output signals R1 to R3 of the second comparator group 10*b* and provides output signals X1 to X3 corresponding thereto. The change point detecting circuits 12*a* and 12*b* have the same circuit construction and an example thereof is shown in FIG. 2B. More specifically, each of the change point detecting circuits 12*a* and 12*b* in this embodiment comprises three exclusive OR circuits 14*a* to 14*c*. The outputs signals Y1 to Y3 of the change point detecting circuit 12*a* and the output signals X1 to X3 of the change point detecting circuit 12*b* are supplied to a matrix circuit 20.

The matrix circuit 20 comprises nine N channel MOS transistors Q1 to Q9 and nine P channel MOS transistors Q10 to Q18 and controls the transmission of the signals X1 to X3 by means of the transistors Q1 to Q18 receiving the signals Y1 to Y3 as gate input. Outputs of the matrix circuit 20 are supplied to digital output terminals 15*a*, 15*b* and 15*c* through OR gates 13*a*, 13*b* and 13*c*, respectively, and also supplied directly to a digital output terminal 15*d*. Digital data obtained by conversion of a product output of two input analogue signals to a binary code is provided from each of those digital output terminals 15*a* to 15*d*.

Description is now made of a circuit construction of the matrix circuit 20. The signal Y3 is supplied to each of the gates of the transistors Q1 to Q3 and Q10 to Q12. The transistor Q1 has one conduction terminal for receiving the signal X3 and the other conduction terminal connected to the OR gate 13*a* and the output terminal 15*d*. One conduction terminal of the transistor Q2 receives the signal X2 and the other conduction terminal thereof is connected to the OR gates 13*b* and 13*c*. One conduction terminal of the transistor Q3 receives the signal X1 and the other conduction terminal thereof is connected to the OR gates 13*a* and 13*b*. The transistor Q10 is interposed between the other conduction terminal of the transistor Q1 and the ground. The transistor Q11 is interposed between the other conduction terminal of the transistor Q2 and the ground. The transistor Q12 is interposed between the other conduction terminal of the transistor Q3 and the ground. The signal Y2 is supplied to each of the gates of the transistors Q4 to Q6 and Q13 and Q15. The transistor Q4 has one conduction terminal for receiving the signal X3 and the other conduction terminal connected to the OR gates 13*b* and 13*c*. The transistor Q5 has one conduction terminal for receiving the signal X2 and the other conduction terminal connected to the OR gate 13*c*. The transistor Q6 has one conduction terminal for receiving the signal X1 and the other conduction terminal connected to the OR gate 13*b*. The transistor Q13 is interposed between the other conduction terminal of the transistor Q4 and the ground. The transistor Q14 is interposed between the other conduction terminal of the transistor Q5 and the ground. The transistor Q15 is interposed between the other conduction terminal of the transistor Q16 and the ground. The signal Y1 is supplied to each of the gates of the transistors Q7 to Q9 and Q16 to Q18. The transistor Q7 has one conduction terminal for receiving the signal X3 and the other conduction terminal connected to the OR gates 13*a* and 13*b*. The transistor Q8 has one conduction terminal for receiving the signal X2 and the other conduction terminal connected to the OR gate 13*b*. The transistor Q9 has one conduction terminal for receiving the signal X1 and the other conduction terminal connected to the OR gate 13*a*. The transistor Q16 is interposed between the other conduction terminal of the transistor Q7 and the ground. The transistor Q17 is interposed between the other conduction terminal of the transistor Q8 and the ground. The transistor Q18 is interposed between the other conduction terminal of the transistor Q9 and the ground.

Now, operation of the above described embodiment will be described.

The first and second comparator groups 10*a* and 10*b* convert the first and second analogue signals applied thereto, respectively, to digital signals by the ladder resistors 3 and the comparators 4 in the same manner as in the conventional device shown in FIG. 6. The digital signals have contiguous logics "1" (except for the case of all logics being "0"), the numbers of the logics "1" corresponding to the values of the input analogue signals. The change point detecting circuits 12*a* and 12*b* in the encoding circuit 11 detect change points of the logics (that is, boundaries between the logics "1" and "0") in the output signals S1 to S3 and R1 to R3 from the first and second comparator groups 10*a* and 10*b*. Corresponding relations between the input signals S1 to S3 and the output signals Y1 to Y3 in the change point detecting circuit 12*a* are indicated below. The corresponding relations between the input signals R1 to R3 and the output signals X1 to X3 in the change point detecting circuit 12*b* are the same as below. As can be seen from table, the output signals Y1 to Y3 and X1 to X3 are of 1-of-n coded format wherein only one of the output lines is of a logic "1" level.

| | |
|---|---|
| S3 = 0 | Y3 = 0 |
| S2 = 0 | Y2 = 0 |
| S1 = 0 | Y1 = 0 |
| S3 = 0 | Y3 = 0 |
| S2 = 0 | Y2 = 0 |
| S1 = 1 | Y1 = 1 |
| S3 = 0 | Y3 = 0 |
| S2 = 1 | Y2 = 1 |
| S1 = 1 | Y1 = 0 |
| S3 = 1 | Y3 = 1 |
| S2 = 1 | Y2 = 0 |
| S1 = 1 | Y1 = 0 |

Now, let us assume a case in which Y1=Y3=0, Y2=1 (S1=S2=1, S3=0), X2, X1=0, and X3=1 (R1=R2=R3=1). In this case, the first comparator group 10*a* "2" and the second comparator group 10*b* outputs "3".

Since Y2=1, the N channel MOS transistors Q4 to Q6 are in a conductive state and the P channel MOS transistors Q13 to Q15 are in a non-conductive state. In addition, since Y1=Y3=0, the other N channel MOS transistors Q1 to Q3 and Q7 to Q9 are in the non-conductive state and the other P channel MOS transistors Q10 to Q12 and Q16 to Q18 are in the conductive state. As a result, the outputs are Z0=Z3=0 and Z1=Z2=1. This output condition corresponds to digital data of a binary code representing "6" if Z0 is LSB and Z3 is MSB. This means the product of the analogue input corresponding to "2" and the analogue input corresponding to "3".

Thus, in the above described embodiment, the first and second analogue signal inputs are compared with the reference voltages and converted to digital signals in the comparator groups 10*a* and 10*b* and those digital signals are converted to the product output of digital data by the encoding circuit 11. Consequently, the chip area can be reduced and the multiplication processing can be performed at high speed and with high precision.

Figure 3:
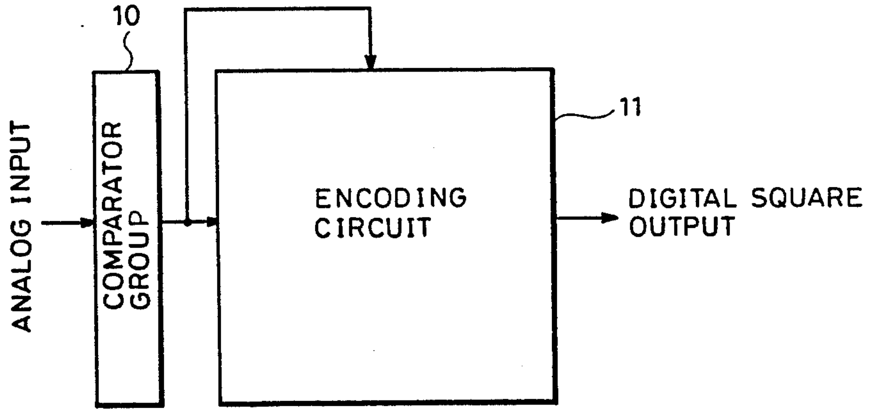
FIG. 3 is a block diagram showing a semiconductor integrated circuit of another embodiment of the present invention.

Although a digital output of a product of two different analogue signals is obtained in the above described embodiment, a digital output may be obtained by squaring an analogue signal. In this case, only one comparator group may be provided as shown in FIG. 3. More specifically, in the embodiment of FIG. 3, the encoding circuit 11 receives outputs from the same comparator group 10 as the first input signals S1 to S3 and as the second input signals R1 to R3 and the results of squaring thereof are converted to digital data Z0 to Z3 as output data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit for providing a product of first and second analogue signals as digital output data, comprising:

a first comparator group having a plurality of comparators for comparing said first analogue signal with a reference potential, a second comparator group having a plurality of comparators for comparing said second analogue signal with a reference potential, and means including a multiplying and encoding circuit for receiving outputs of said first and second comparator groups and for converting the outputs to digital data of a binary code corresponding to the product of said first and second analogue signals.

2. A semiconductor integrated circuit in accordance with claim 1, wherein said first and second comparator groups convert said first and second analogue signals applied thereto, respectively, to a digital signal in which a change point between a first logic and a second logic changes dependent on the values of said first and second analogue signals.

3. A semiconductor integrated circuit for providing a product of first and second analogue signals as digital output data, comprising:

a first comparator group having a plurality of comparators for comparing said first analogue signal with a reference potential, a second comparator group having a plurality of comparators for comparing said second analogue signal with a reference potential, and means including a multiplying and an encoding circuit for receiving outputs of said first and second comparator groups and for converting the outputs to digital data of a binary code corresponding to the product of said first and second analogue signals, wherein said first and second comparator groups convert said first and second analogue signals applied thereto, respectively, to a digital signal in which a change point between a first logic and a second logic changes dependent on the values of said first and second analogue signals, and wherein said encoding circuit comprises:

a first change point detecting circuit for detecting a change point in the logic of the outputs of said first comparator group, a second change point detecting circuit for detecting a change point in the logic of the outputs of said second comparator group, a matrix circuit including a plurality of transistors each having a gate for receiving the output of said first change point detecting circuit, for controlling transmission of the output of said second change point detecting circuit based on the output of said first change point detecting circuit, and a plurality of gate circuits for receiving an output of said matrix circuit.

4. A semiconductor integrated circuit for providing the square of an analogue signal as digital output data, comprising:

a comparator group having a plurality of comparators for comparing said analogue signal with a reference voltage, and means including a multiplying and encoding circuit for receiving an output of said comparator group and for converting said output to digital data of a binary code corresponding to the square of said analogue signal.

5. A semiconductor integrated circuit for a providing a product of first and second analog input data as digital output data, comprising:

first analog data weighting means having an input node receiving said first analog data and a plurality of output nodes and responsive to said first analog data for providing a first logic level from one of said plurality of output nodes and for providing a second logic level from the remaining output nodes, second analog data weighting means having an input node receiving said second analog data and a plurality of output nodes and responsive to said second analog data for providing a first logic level from one of said plurality of output nodes and for providing a second logic level from the remaining output nodes, and means having first input nodes receiving said first and second logic levels from said output nodes of said first analog data weighting means and second input nodes receiving said first and second logic levels from said output nodes of said second analog data weighting means and responsive to said first and second logic levels applied to said first input nodes and to said first and second logic levels applied to said second input nodes for providing digital output data representing a product of said first and second analog data.

6. A semiconductor integrated circuit for a providing a square of analog input data as digital output data, comprising:

analog data weighting means having an input node receiving said analog input data and a plurality of output nodes and responsive to said analog input data for providing a first logic level from one of said plurality of output nodes and for providing a second logic level from the remaining output nodes, and means having first input nodes receiving said first and second logic levels from said output nodes of said analog data weighting means and second input nodes receiving said first and second logic levels from said output nodes of said analog data weighting means and responsive to said first and second logic levels applied to said first input nodes and to said first and second logic levels applied to said second input nodes for providing digital output data representing a squaring product of said analog data.

7. A multiplier circuit for providing a binary output of the product of two input signals including p1 a matrix circuit for receiving first and second 1-of-n coded digital signals and including a plurality of transistors, each transistor having a gate connected to at least one of said first and second 1-of-n coded digital signals, for controlling transmission of one of said first and second 1-of-n coded digital signals to the output of said matrix circuit in response to said at least one of said first and second 1-of-n coded digital signals, and a plurality of gate circuits for receiving signals appearing on said outputs of said matrix circuit and outputting a digital code representing a product of said first and second 1-of-n coded binary signals.

8. A multiplier circuit as recited in claim 7, further including at least one digital code converting circuit means for receiving a signal and outputting a b 1-of-n code to an input of said matrix circuit corresponding to said digital signal.

9. A multiplier circuit as recited in claim 8 wherein said signal received by said digital code converting circuit means is a parallel digital signal.

10. A multiplier circuit as recited in claim 9, further including at least one change point detecting circuit means for receiving said parallel digital signal as a thermometer code and outputting said 1-of-n code.

11. A multiplier circuit as recited in claim 10, further including at least one comparator circuit means for receiving an analog signal, comparing said analog signal to a reference voltage and outputting a thermometer code corresponding to said analog signal as said parallel digital signal as an input to said at least one change point detecting circuit means.

12. A multiplier circuit as recited in claim 7 wherein said first and second 1-of-n coded digital signals provided to said matrix circuit are identical.

13. A multiplier circuit as recited in claim 7 wherein said first and second 1-of-n coded digital signals provided to said matrix circuit are independent of each other.

14. A multiplier circuit as recited in claim 7, further including a plurality of digital code converting circuit means each for receiving a respective signal and outputting a 1-of-n code to a respective input of said matrix circuit corresponding to said digital signal.

15. A multiplier circuit as recited in claim 14 wherein each said respective signal is a parallel digital signal.

16. A multiplier circuit as recited in claim 14, further including at least one change point detecting circuit means for receiving one said parallel digital signal as a thermometer code and outputting said 1-of-n code.

17. A multiplier circuit as recited in claim 15, further including a change point detecting circuit means for receiving each said parallel digital signal as a thermometer code and outputting said 1-of-n code.

18. A semiconductor integrated circuit for providing a product of first and second analog signals and converting the product to digital data, comprising:

at least one changing point detecting circuit for receiving a thermometer code in which all bits thereof corresponding to values less than an input value have one logic value and all bits thereof corresponding to values greater than an input value have another logic value and outputting a code in which a single bit has a logic value which is distinct from other bits in response to the adjacent bits in said thermometer code have differing logic values, and a multiplying and encoding circuit comprising a. a matrix circuit having means for receiving two input signals including at least said output of said changing point detecting circuit as a first input thereto and providing a digital signal representing the product of said two input values, said matrix circuit including a plurality of transistors, each having a gate for receiving the output of said at least one changing point detecting circuit, for controlling the transmission of said second input of said matrix circuit to an output of said matrix circuit, and b. gate circuit means responsive to said digital signal output by said matrix circuit and outputting a binary signal representative thereof.

19. A semiconductor integrated circuit for providing a product of first and second analog signals and converting the product to digital data as recited in claim 18, wherein said output of said at least one changing point detecting circuit is applied to both of said two inputs of said matrix circuit whereby said semiconductor integrated circuit provides a binary output corresponding to a square of an input analog signal.

20. A semiconductor integrated circuit for providing a product of first and second analog signals and converting the product to digital data as recited in claim 18, further including a second changing point detecting circuit providing an output as said second input to said matrix circuit.

* * * * *